(12) United States Patent
Yamamoto

(10) Patent No.: US 7,850,799 B2
(45) Date of Patent: Dec. 14, 2010

(54) METHOD FOR AFFIXING ADHESIVE TAPE TO SEMICONDUCTOR WAFER, AND APPARATUS USING THE SAME

(75) Inventor: Masayuki Yamamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 945 days.

(21) Appl. No.: 11/701,503

(22) Filed: Feb. 2, 2007

(65) Prior Publication Data
US 2007/0193672 A1 Aug. 23, 2007

(30) Foreign Application Priority Data
Feb. 22, 2006 (JP) .............................. 2006-045641

(51) Int. Cl.
*B32B 41/00* (2006.01)
(52) U.S. Cl. .................. 156/64; 156/230; 156/247
(58) Field of Classification Search .................. 156/64, 156/230, 247, 361, 543, 552
See application file for complete search history.

(56) References Cited
U.S. PATENT DOCUMENTS
2004/0140039 A1 7/2004 Yamamoto

2007/0131344 A1 6/2007 Tsujimoto et al.

FOREIGN PATENT DOCUMENTS

| JP | 4-340746 A | 11/1992 |
|----|------------|---------|
| JP | 10-330022 A | 12/1998 |
| JP | 2004-025438 A | 1/2004 |
| JP | 2004-221469 A | 8/2004 |
| JP | 2005-236049 A | 9/2005 |
| WO | WO-2005/036628 A1 | 4/2005 |

OTHER PUBLICATIONS

Notification of Reasons for Refusal for the Application No. 2006-045641 mailed Mar. 17, 2009.
Chinese Office Action for the Application No. 2007100798736 from China Patent Office dated Jun. 5, 2009.

*Primary Examiner*—George R Koch, III
(74) *Attorney, Agent, or Firm*—Cheng Law Group, PLLC

(57) ABSTRACT

In association with movement of an affixation roller, a movement position of the affixation roller is detected by a rotation sensor based on a rotation amount of a motor. A control device changes and controls an amount of an adhesive tape to be fed forcibly based on a result of the detection, and keeps a tensile force applied to the adhesive tape in the affixation of the adhesive tape to the semiconductor wafer within a preset range.

2 Claims, 5 Drawing Sheets

METHOD FOR AFFIXING ADHESIVE TAPE TO SEMICONDUCTOR WAFER, AND APPARATUS USING THE SAME

BACKGROUND OF THE INVENTION (1) Field of the Invention

The present invention relates to a method for affixing an adhesive tape to a semiconductor wafer subjected to surface treatment in order to protect a surface of the semiconductor wafer, and an apparatus using this method.

(2) Description of the Related Art

JP-A 2004-025438 discloses one example of a technique for affixing an adhesive tape to a semiconductor wafer. According to this technique, an adhesive tape fed from a tape supplying section is affixed to a surface of a semiconductor wafer while being pressed against the surface of the semiconductor wafer by an affixation roller. In this technique, the adhesive tape is fed from the tape supplying section by a tensile force generated when the affixation roller moves relative to the semiconductor wafer while pressing the adhesive tape. Herein, a back tension is applied to the tape supplying section so as to prevent the adhesive tape from being fed excessively or to prevent the adhesive tape from sagging.

In a case of affixing an adhesive tape to a semiconductor wafer, a tensile force to be applied to the adhesive tape is unbalanced, so that the adhesive tape affixed to the semiconductor wafer becomes ununiform in thickness. Consequently, there arises a problem that the semiconductor wafer becomes ununiform in thickness in a subsequent back grinding process.

In addition, there is a possibility that the semiconductor wafer is warped or deformed due to shrinkage of the adhesive tape affixed to the semiconductor wafer while being applied with an ununiform tensile force, so that trouble is caused in the back grinding process.

In order to solve these problems, according to the technique disclosed in JP-A 2004-025438, a back tension applied upon affixation of an adhesive tape to a semiconductor wafer is temporarily made small; thus, the adhesive tape is affixed to the semiconductor wafer without being applied with an undue tensile force.

Such small back tension makes it possible to prevent the adhesive tape from being applied with an undue tensile force, but causes a problem that a wrinkle occurs at the adhesive tape.

SUMMARY OF THE INVENTION

The present invention is devised in view of the aforementioned circumstances. An object of the present invention is to provide a method capable of uniformly affixing an adhesive tape to a semiconductor wafer without applying an undue tensile force to the adhesive tape, and an apparatus using this method.

In order to accomplish the aforementioned object, the present invention adopts the following configuration.

A method for affixing an adhesive tape fed from a tape supplying section to a surface of a semiconductor wafer in such a manner that an affixation roller rolls on the adhesive tape while pressing the adhesive tape against the surface of the semiconductor wafer comprises the step of changing and controlling an amount of the adhesive tape to be fed forcibly in accordance with the movement of the affixation roller, and keeping a tensile force applied to the adhesive tape in the affixation of the adhesive tape to the semiconductor wafer within a set range.

With this method according to the present invention, an adhesive tape having an amount required for affixation to a semiconductor wafer is supplied in accordance with movement of the affixation roller. Then, the adhesive tape is affixed to the semiconductor wafer while being applied with a tensile force falling within a set range. That is, no undue tensile force is applied to the adhesive tape to be fed. In other words, the adhesive tape is affixed to the semiconductor wafer while being applied with a tensile force uniformly. As a result, the adhesive tape becomes uniform in thickness. Thus, it is possible to render a thickness of the semiconductor wafer uniform in a subsequent process such as a back grinding process. Further, the adhesive tape is applied with no ununiform tensile force; therefore, no wrinkle occurs at the adhesive tape.

Preferably, the changing and controlling step is performed in accordance with a characteristic preset based on the position of the affixation roller relative to the semiconductor wafer.

The characteristic is, for example, the amount of the adhesive tape to be fed forcibly, which is previously determined in accordance with the position of the affixation roller detected by a rotation sensor.

The amount of the adhesive tape to be fed forcibly is made large as a distance of the movement of the affixation roller becomes long.

With this method, an amount of an adhesive tape required for affixation to a semiconductor wafer is obtained in advance from a position and a movement speed of the affixation roller. Accordingly, the present invention can be suitably carried out by adjusting the amount of the adhesive tape to be fed forcibly in accordance with a characteristic, for example, a rolling position of the affixation roller.

In the changing and controlling step, preferably, an amount of the adhesive tape to be fed is previously determined in accordance with a tensile force applied to the adhesive tape in the affixation of the adhesive tape to the semiconductor wafer, the tensile force applied to the adhesive tape in the affixation of the adhesive tape to the semiconductor wafer is detected by a sensor, and the amount of the adhesive tape to be fed forcibly is changed in accordance with a result of the detection. More preferably, the amount of the adhesive tape to be fed is made large as the tensile force applied to the adhesive tape becomes large.

In order to accomplish the aforementioned object, the present invention also adopts the following configuration.

An apparatus for affixing an adhesive tape fed from a tape supplying section to a surface of a semiconductor wafer in such a manner that an affixation roller rolls on the adhesive tape while pressing the adhesive tape against the surface of the semiconductor wafer comprises: a holding table for holding the semiconductor wafer placed thereon; adhesive tape supply means for supplying the adhesive tape to the surface of the semiconductor wafer placed on and held by the holding table; an affixing unit for allowing the affixation roller to roll on the adhesive tape, to press the adhesive tape against the surface of the semiconductor wafer and to affix the adhesive tape to the surface of the semiconductor wafer; roller position detection means for detecting a movement position of the affixation roller; tape forcible feed-means for feeding the adhesive tape toward the affixing unit; and control means for changing an amount of the adhesive tape to be fed forcibly by the tape forcible feed means in accordance with a characteristic preset based on the position of the affixation roller detected by the roller position detection means.

Preferably, the characteristic for determining the amount of the adhesive tape to be fed forcibly is set such that the amount of the adhesive tape to be fed forcibly is made large as a distance of the movement of the affixation roller becomes long, and the control means changes the amount of the adhesive tape to be fed forcibly by the tape forcible feed means in accordance with the set characteristic.

The apparatus according to the present invention can suitably implement the aforementioned method according to the present invention.

In order to accomplish the aforementioned object, the present invention also adopts the following configuration.

An apparatus for affixing an adhesive tape fed from a tape supplying section to a surface of a semiconductor wafer in such a manner that an affixation roller rolls on the adhesive tape while pressing the adhesive tape against the surface of the semiconductor wafer comprises: a holding table for holding the semiconductor wafer placed thereon; adhesive tape supply means for supplying the adhesive tape to the surface of the semiconductor wafer placed on and held by the holding table; an affixing unit for allowing the affixation roller to roll on the adhesive tape, to press the adhesive tape against the surface of the semiconductor wafer and to affix the adhesive tape to the surface of the semiconductor wafer; tensile force detection means for detecting forces applied to the adhesive tape; tape forcible feed means for feeding the adhesive tape toward the affixing unit; and control means for changing an amount of the adhesive tape to be fed forcibly by the tape forcible feed means in accordance with a preset characteristic of the amount of the adhesive tape to be fed forcibly, based on the tensile force applied to the adhesive tape detected by the tensile force detection means in the affixation of the adhesive tape to the semiconductor wafer.

With this configuration, an adhesive tape can be affixed to a semiconductor wafer while being applied with a uniform tensile force. Accordingly, the adhesive tape can be affixed to the semiconductor wafer while rendering a thickness thereof uniform. Further, the semiconductor wafer can be made uniform in thickness in a subsequent back grinding process. In addition, the adhesive tape is applied with no undue tensile force; therefore, no wrinkle occurs at the adhesive tape.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENT

Hereinafter, description will be given of an embodiment of the present invention with reference to the drawings.

Figure 1:
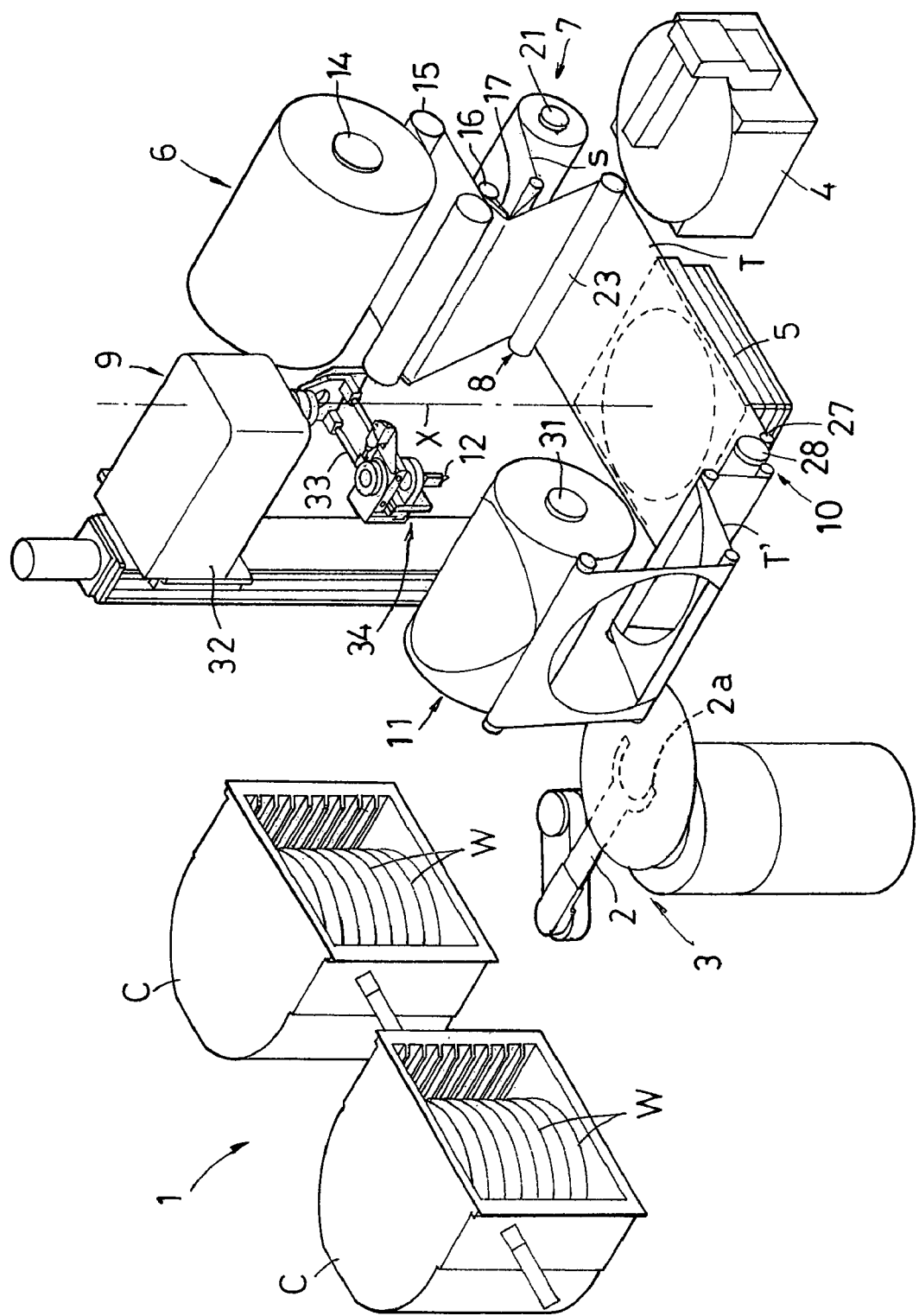
FIG. 1 is a perspective view illustrating main components of an adhesive tape affixing apparatus.

FIG. 1 is a perspective view illustrating a general configuration of an adhesive tape affixing apparatus.

The adhesive tape affixing apparatus comprises a wafer supplying/collecting section 1, a wafer transporting mechanism 3, an alignment stage (aligner) 4, a chuck table 5, a tape supplying section 6, a separator collecting section 7, an affixing unit 8, a tape cutting mechanism 9, a separating unit 10, a tape collecting section 11, and the like. Herein, the wafer supplying/collecting section 1 includes two cassettes C each housing a semiconductor wafer (hereinafter, simply referred to as "wafer") W. The wafer transporting mechanism 3 has a robot arm 2. The chuck table 5 suction-holds a wafer W placed thereon. The tape supplying section 6 supplies an adhesive tape T toward a wafer W. The adhesive tape T is used for protecting a surface of a wafer W and is provided with a separator s. The separator collecting section 7 separates a separator s from an adhesive tape T supplied from the tape supplying section 6, and collects the separator s. The affixing unit 8 affixes an adhesive tape T to a wafer W placed on and suction-held by the chuck table 5. The tape cutting mechanism 9 cuts an adhesive tape T affixed to a wafer W along an outer periphery of the wafer W. The separating unit 10 separates an unnecessary tape T' from an adhesive tape T which is affixed to a wafer W and, then, is cut along an outer periphery of the wafer W. The tape collecting section 11 collects an unnecessary tape T' separated by the separating unit 10 while reeling the unnecessary tape T'. Hereinafter, detailed description will be given of the aforementioned structural components.

In the wafer supplying/collecting section 1, the two cassettes C are arranged in parallel. Stacked wafers W, each having a wiring pattern face directed upward, are housed in each cassette C in a horizontal position.

The robot arm 2 of the wafer transporting mechanism 3 is movable horizontally. Further, the robot arm 2 is turnable and movable vertically as a whole. The robot arm 2 has a tip end provided with a horse shoe-shaped wafer holding part 2a of a vacuum suction type. The wafer holding part 2a is inserted between wafers W housed in the cassette C and suction-holds a back side (bottom side) of the upper wafer W. Then, the wafer holding part 2a pulls out the wafer W from the cassette C and transfers the wafer W to the alignment stage 4, the chuck table 5 and the wafer supplying/collecting section 1 in this order.

The alignment stage 4 performs alignment on a wafer W transferred thereto and placed thereon by the wafer transporting mechanism 3 based on a notch or an orientation flat formed at an outer periphery of the wafer W.

The chuck table 5 vacuum-sucks a wafer W transferred thereto by the wafer transporting mechanism 3 and placed thereon in a predetermined alignment position. A cutter traveling groove 13 (see FIG. 3) is formed on a top face of the chuck table 5. In the cutter traveling groove 13, a cutter blade 12 of the tape cutting mechanism 9 (to be described later) turns along an outer periphery of a wafer W, thereby to cut an adhesive tape T affixed to the wafer W. In addition, a suction-holding part 5a (see FIG. 2) is provided on a center of the chuck table 5 so as to protrude from/retreat into the chuck table 5 upon transfer of a wafer W. It is to be noted that the chuck table 5 corresponds to a holding table in the present invention.

Figure 2:
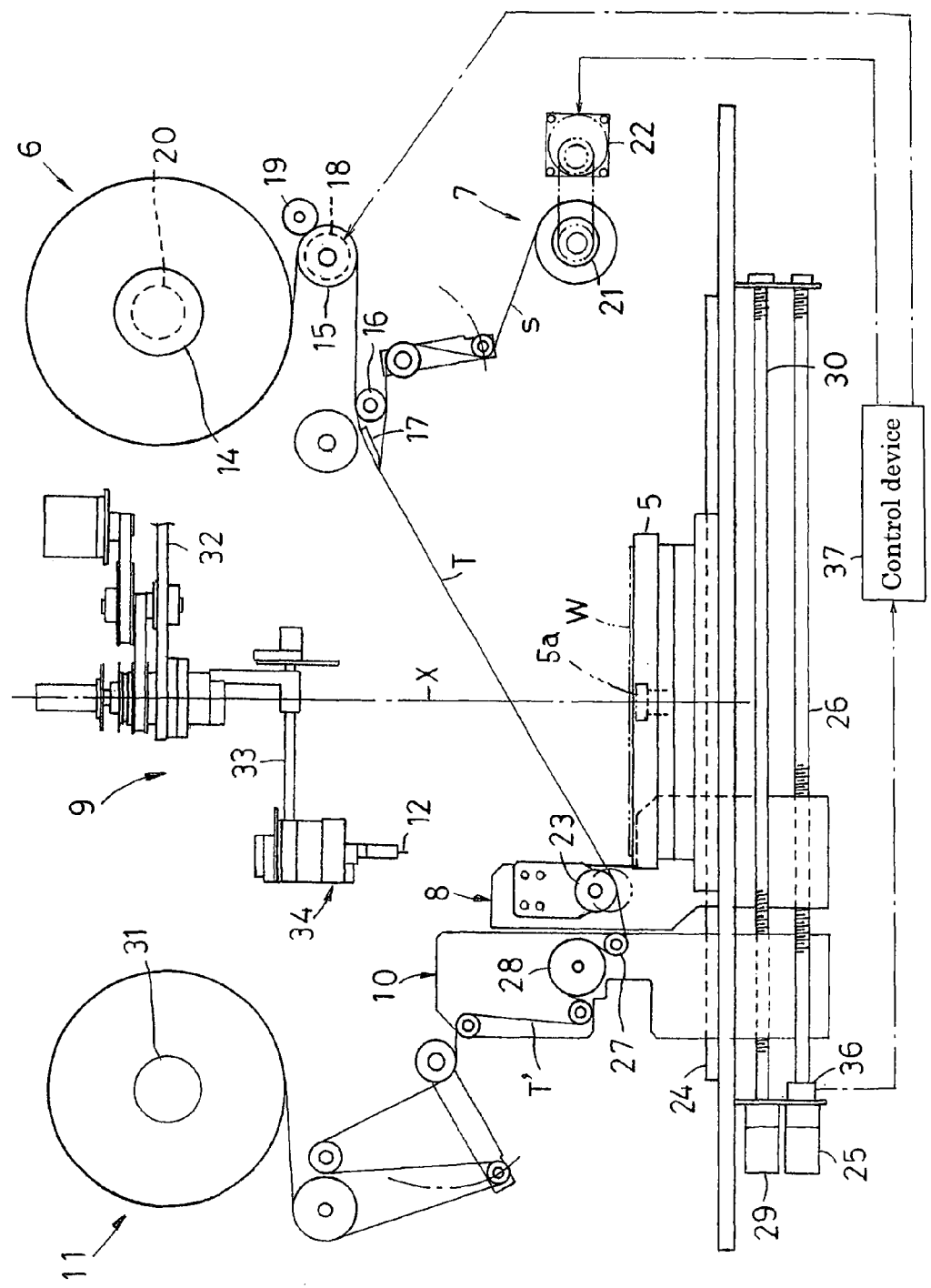
FIG. 2 is a front view illustrating the adhesive tape affixing apparatus.

In the tape supplying section 6, as illustrated in FIG. 2, a feed roller 15 and a guide roller 16 guide an adhesive tape T with a separator s, which is fed from a supply bobbin 14, toward a separation guide bar 17 formed into an edge of a knife. The adhesive tape T is folded back at a leading edge of the separation guide bar 17 and, then, is separated from the separator s. Further, the adhesive tape T separated from the separator s is guided toward the affixing unit 8. It is to be noted that the tape supplying section 6 corresponds to adhesive tape supply means in the present invention.

The feed roller 15 pinches an adhesive tape T in cooperation with a pinch roller 19, and is rotated by a motor 18. If necessary, the feed roller 15 forcibly feeds an adhesive tape T. It is to be noted that the feed roller 15, the pinch roller 19 and the motor 18 correspond to tape forcible feed means in the present invention.

The supply bobbin 14 is interlocked with and coupled to an electromagnetic brake 20 so as to receive appropriate rotational resistance. As a result, an adhesive tape T is prevented from being-excessively fed from the supply bobbin 14.

The separator collecting section 7 includes a collection bobbin 21 reeling a separator s separated from an adhesive tape T, and a motor 22 controls forward/backward rotation of the collection bobbin 21.

The affixing unit 8 includes an affixation roller 23 a position of which is changeable vertically by a cylinder (not illustrated). As a whole, the affixing unit 8 is supported on a guide rail 24 so as to be movable horizontally along the guide rail 24, and is allowed to reciprocate through a screw shaft 26 rotated by a motor 25 in a forward/backward direction.

The separating unit 10 includes a separation roller 27, and a feed roller 28 driven by a motor. As a whole, the separating unit 10 is supported on the guide rail 24 so as to be movable horizontally along the guide rail 24, and is allowed to reciprocate through a screw shaft 30 rotated by a motor 29 in the forward/backward direction.

The tape collecting section 11 includes a collection bobbin 31 driven by a motor and is rotated in a direction of reeling an unnecessary tape T'.

In the tape cutting mechanism 9, a support arm 33 is provided below a bench 32 movable vertically, so as to turn about a vertical axis X on the center of the chuck table 5. The support arm 33 has a free end provided with a cutter unit 34, and the cutter unit 34 includes the cutter blade 12 having a blade edge directed downward. When the support arm 33 turns about the vertical axis X, the cutter blade 12 travels along an outer periphery of a wafer W, thereby to cut an adhesive tape T affixed to the wafer W.

A control device 37 controls rotation of each motor. Detailed description thereof will be given later.

With reference to FIGS. 2 to 7, next, description will be given of a sequence of basic operations for affixing an adhesive tape T to a surface of a wafer W, in order to protect the surface of the wafer W, by means of the apparatus according to this embodiment.

Upon acceptance of an adhesive tape affixing command, first, the robot arm 2 of the wafer transporting mechanism 3 moves toward the cassette C of the wafer supplying/collecting section 1, and the wafer holding part 2a is inserted between wafers W housed in the cassette C. Then, the wafer holding part 2a suction-holds a back side (bottom side) of the upper wafer W, pulls out the wafer W from the cassette C, and transfers the wafer W to the alignment stage 4.

The alignment stage 4 performs alignment on the wafer W placed thereon based on a notch or an orientation flat formed at an outer periphery of the wafer W. After performance of the alignment, the robot arm 2 holds the wafer W on the alignment stage 4 and transfers the wafer W to the chuck table 5.

The chuck table 5 suction-holds the wafer W placed thereon such that a center of the chuck table 5 is aligned with a center of the wafer W. Herein, as illustrated in a left side of FIG. 2, the affixing unit 8 and the separating unit 10 are in initial positions, respectively. In addition, as illustrated in an upper side of FIG. 2, the cutter blade 12 of the tape cutting mechanism 9 is in an initial position on standby.

Figure 3:
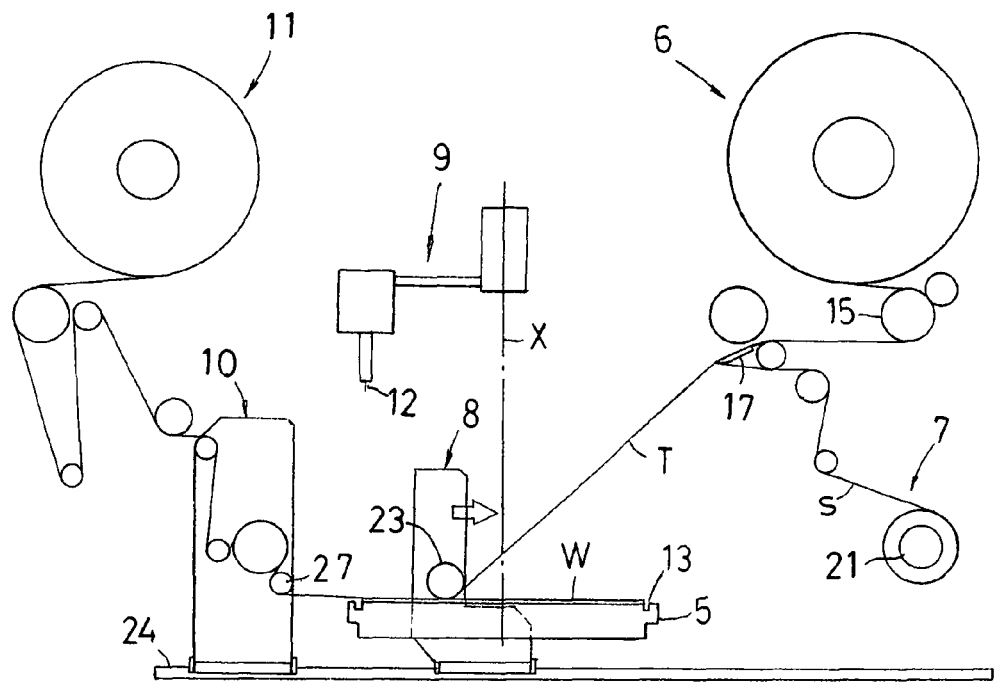
FIG. 3 is a front view illustrating an adhesive tape affixing step.

Next, as illustrated in FIG. 3, the affixation roller 23 moves downward and the affixing unit 8 moves forward. Then, the affixation roller 23 rolls forward (rightward in FIG. 3) on an adhesive tape T while pressing the adhesive tape T against the wafer W. Herein, the adhesive tape T is gradually affixed to a surface of the wafer W from left to right in FIG. 3.

Figure 4:
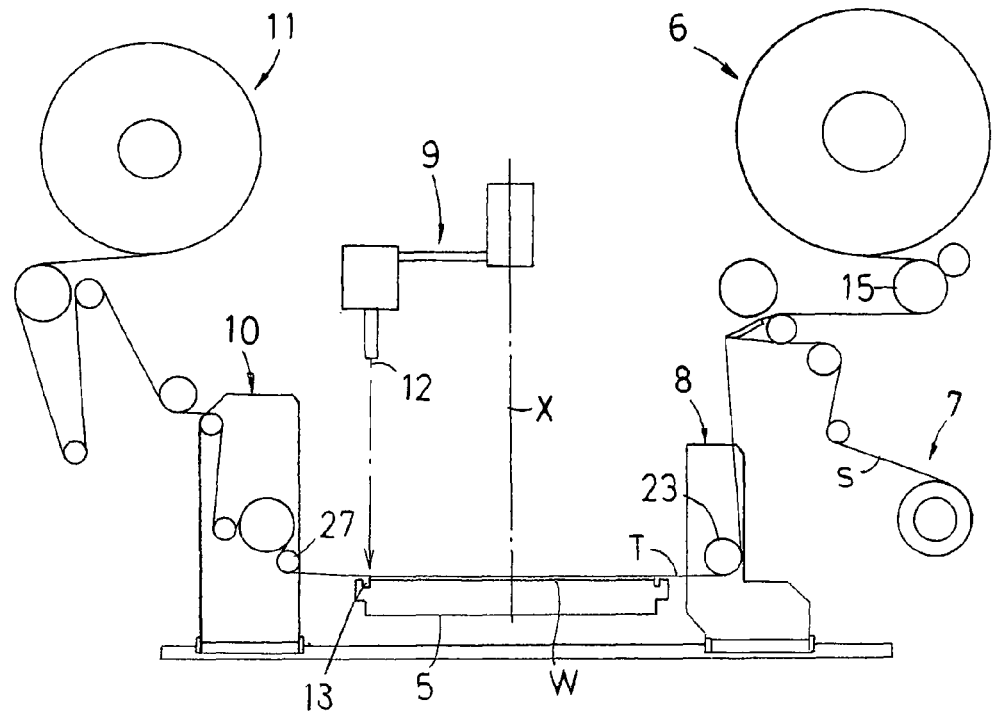
FIG. 4 is a front view illustrating an adhesive tape affixing step.

Next, as illustrated in FIG. 4, when the affixing unit 8 reaches a termination position beyond the chuck table 5, the cutter blade 12 situated above the chuck table 5 on standby moves downward, and the adhesive tape T is stuck with the cutter blade 12 at the cutter traveling groove 13 of the chuck table 5.

Figure 5:
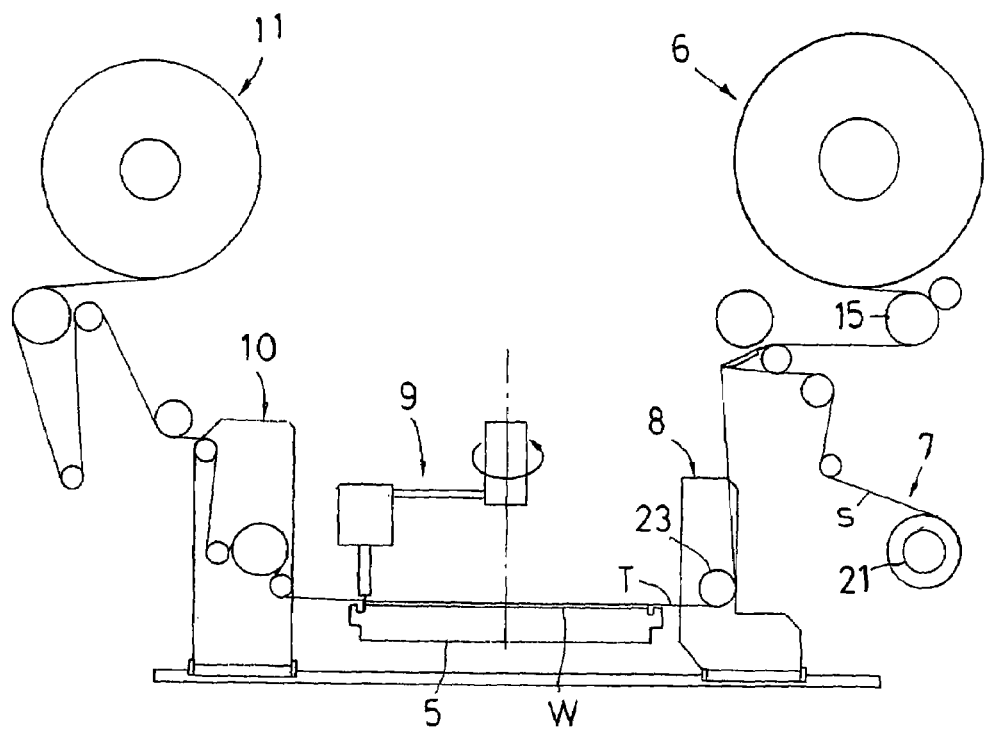
FIG. 5 is a front view illustrating an adhesive tape affixing step.

Next, as illustrated in FIG. 5, when the cutter blade 12 moves downward and stops at a position corresponding to a predetermined height, the support arm 33 is rotated in a predetermined direction. Thus, the cutter blade 12 turns about the vertical axis X to cut the adhesive tape T along the outer periphery of the wafer W.

Figure 6:
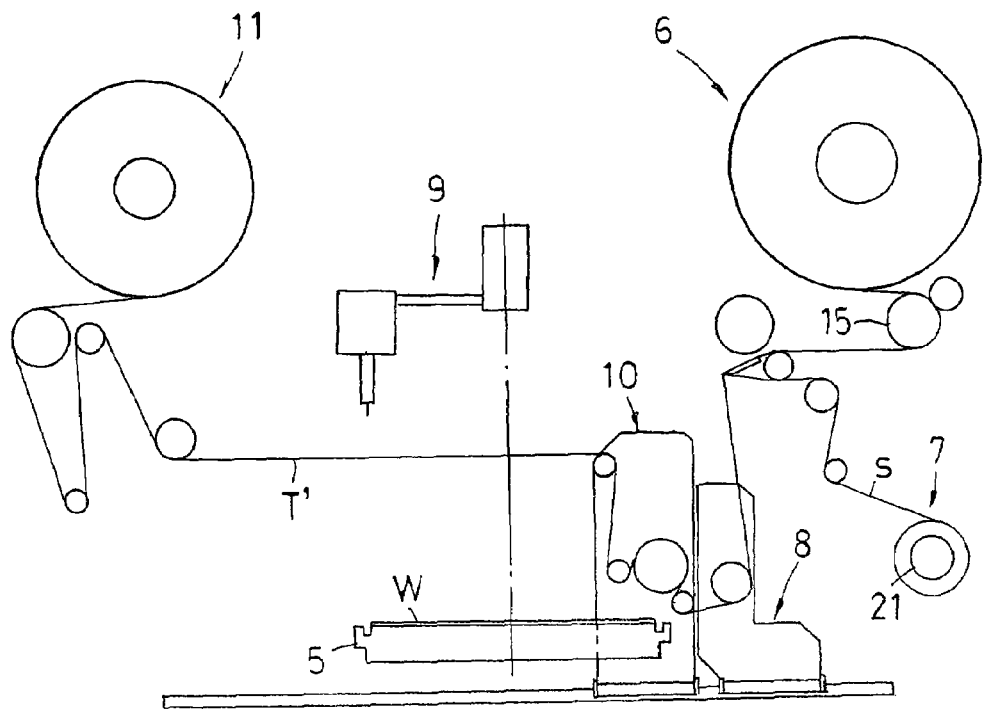
FIG. 6 is a front view illustrating an adhesive tape affixing step.

Next, as illustrated in FIG. 6, after completion of the cutting of the adhesive tape T along the outer periphery of the wafer W, the cutter blade 12 moves upward so as to return to the initial position. Further, the separating unit 10 moves forward to separate an unnecessary tape T' from the adhesive tape T, which is affixed to the wafer W and is cut along the outer periphery of the wafer W, while reeling the unnecessary tape T'.

Figure 7:
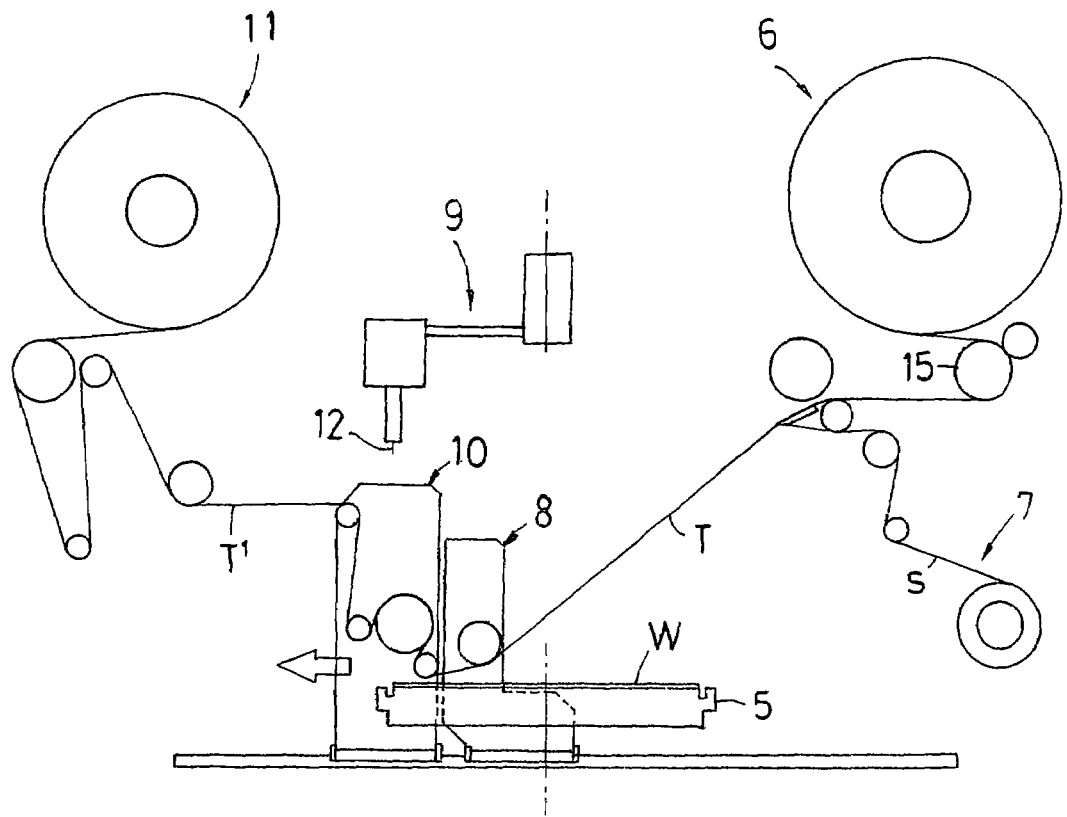
FIG. 7 is a front view illustrating an adhesive tape affixing step.

Next, as illustrated in FIG. 7, when the separating unit 10 reaches a termination position of the separation, the separating unit 10 and the affixing unit 8 move in a reverse direction so as to return to the initial positions, respectively. Herein, the collection bobbin 31 reels the unnecessary T' tape and the tape supplying section 6 supplies an adhesive tape T by a predetermined amount.

After completion of the adhesive tape affixing operation, the chuck table 5 releases the suction of the wafer W, and the suction-holding part 5a holds the wafer W and lifts the wafer W upward. Then, the wafer holding part 2a of the robot arm 2 holds the wafer W and inserts the wafer W into the cassette C of the wafer supplying/collecting section 1.

Thus, an adhesive tape affixing process is completed. Thereafter, the aforementioned operations are sequentially performed in a repetitive manner.

In this adhesive tape affixing process, an adhesive tape T, which is supplied obliquely in a downward direction at an initial stage of the affixation, is affixed to a wafer W while being pressed against the wafer W by the affixation roller 23 which moves horizontally. Herein, an amount of the adhesive tape T to be fed from the tape supplying section 6 varies depending on a position of the affixation roller 23. That is, as the affixation of the adhesive tape T to the wafer W progresses, the amount of the adhesive tape T to be fed is increased.

As a result, a tensile force applied to the adhesive tape T positively pulled by the affixation roller 23 gradually becomes large; thus, the adhesive tape T is disadvantageously affixed to the wafer W while being applied with an ununiform tensile force. Consequently, the affixed adhesive tape T is varied in thickness, which causes an ununiform thickness of the wafer W in a back grinding process. Further, there is a possibility that the wafer W is warped or deformed due to shrinkage of the adhesive tape T.

In order to prevent the adhesive tape T from being affixed to the wafer W while being applied with an ununiform tensile force, an operation for controlling supply of the adhesive tape T is performed as follows.

Specifically, as illustrated in FIG. 2, the control device 37 including a rotation sensor 36 such as a rotary encoder is connected to the motor 25 allowing the affixing unit 8 to move through the screw shaft. This rotation sensor 36 detects a movement position of the affixation roller 23 based on a rotation amount of the motor 25. The control device 37 is also connected to the motor 18 driving the feed roller (forcible feed means) 15, and controls the rotation of the feed roller 15 based on the detected movement position of the affixation roller 23. That is, an amount of the adhesive tape T forcibly fed to an affixation position is changed in association with the progress of the adhesive tape affixing operation. It is to be noted that the rotation sensor 36 and the control device 37 correspond to roller position detection means and control means in the present invention, respectively.

Figure 8:
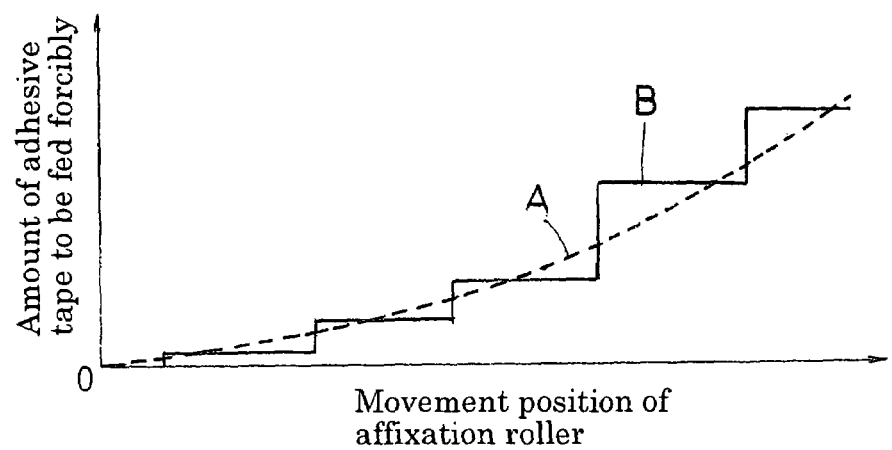
FIG. 8 is a graph showing a relation between a movement position of an affixation roller and an amount of an adhesive tape to be fed.

FIG. 8 shows a change characteristic A of a required amount of the adhesive tape T with respect to the movement position of the affixation roller 23, and a change characteristic B of an amount of the adhesive tape T to be fed forcibly by the feed roller 15. Herein, the change characteristic B of the amount of the adhesive tape T to be fed forcibly is increased step by step along the change characteristic A of the required amount of the adhesive tape T. This indicates that slight tension and slight looseness occur at the adhesive tape T repeatedly. However, the adhesive tape T is uniformly affixed to the wafer W while being applied with a tensile force of a minimum value on average.

Desirably, the change characteristic B of the amount of the adhesive tape T to be fed forcibly has the number of change steps as large as possible. Ideally, it is optimal that the change characteristic B of the amount of the adhesive tape T to be fed forcibly is changed linearly along the change characteristic A of the required amount of the adhesive tape T.

As described above, when the affixation roller 23 rolls on an adhesive tape T so as to affix the adhesive tape T to a wafer W, the adhesive tape T is positively fed by an amount (length) in accordance with a position at which the affixation roller 23 rolls. Thus, the affixation roller 23 cannot forcibly pull the adhesive tape T from the supply bobbin 14. In other words, the adhesive tape T is prevented from being applied with an unnecessary tensile force. Accordingly, the adhesive tape T can be affixed to the wafer W while being applied with a uniform tensile force, so that it is possible to render a thickness of the adhesive tape T uniform. As a result, it is possible to render a thickness of the wafer W uniform in a subsequent back grinding process. In addition, if the tensile force is minute, a shrinkage force of an adhesive tape T becomes small; therefore, a wafer W subjected to back grinding is prevented from being warped and deformed.

The present invention may be embodied as follows.

(1) If the affixation roller 23 has a fixed movement speed, the movement position of the affixation roller 23 can be specified based on a time elapsed from a start of affixation. Accordingly, from a time point at which the affixation roller 23 reaches an end of a wafer W, which is defined as a start point, an amount of an adhesive tape T to be fed forcibly can be changed and controlled by a preset change characteristic in accordance with a lapse of time.

For example, by means of a tensile force applied to an adhesive tape T measured for each affixation lapse time, the amount of the adhesive tape T to be fed is obtained such that this tensile force constantly falls within a predetermined range, and is inputted as a program to the control device 37. Concurrently with a start of affixing the adhesive tape T to a wafer W, the control device 37 performs programmed control of feed of the adhesive tape T in accordance with a time measured by a timer incorporated in the control device 37.

With this configuration, it is unnecessary to successively detect a movement position of the affixation roller 23.

(2) A tensile force sensor of a contact type or a non-contact type, which is tensile force detection means, detects a tensile force applied to an adhesive tape T in an adhesive tape supply path. Based on information about the detection, an amount of the adhesive tape T to be fed forcibly is controlled. Thus, the adhesive tape T can be affixed to a wafer W while being applied with a low tensile force without a hitch. Herein, when the amount of the adhesive tape T to be fed forcibly is calculated based on a deviation from a target value of a tensile force, such an affixing operation can be performed with higher accuracy. With this configuration, an adhesive tape T can be desirably affixed to a wafer W without changing or adjusting a characteristic of forcible feed control in accordance with an affixation movement distance (wafer size) of the affixation roller 23 or a movement speed of the affixation roller 23.

(3) In the aforementioned embodiment, the motor 18 includes a rotation sensor such as a rotary encoder. The rotation sensor may detect an amount of an adhesive tape T to be fed forcibly, and may finely adjust the amount of the adhesive tape T to be fed forcibly based on a result of the detection and a movement position of the affixation roller 23 obtained from a rotation amount of the motor 25.

(4) In the aforementioned embodiment, an amount of an adhesive tape T to be fed is changed and controlled in accordance with a movement position of the affixation roller 23. However, the aforementioned embodiment may be configured as follows. For example, an adhesive tape T is previously fed by an amount that the affixation roller 23 rolls on the adhesive tape T, so that the adhesive tape T is affixed to a wafer W without being applied with a tensile force. With this configuration, the adhesive tape T can be affixed to a surface of the wafer W without being applied with a tensile force; therefore, the wafer W is not warped after being subjected to back grinding.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method for affixing an adhesive tape fed from a tape supplying section to a surface of a semiconductor wafer in such a manner that an affixation roller rolls on the adhesive tape while pressing the adhesive tape against the surface of the semiconductor wafer, the method comprising the steps of:

detecting a position of the affixation roller that rolls on the surface of the semiconductor wafer by a rotation sensor; and keeping a tensile force applied to the adhesive tape in the affixation of the adhesive tape within a set range based on an amount of the adhesive tape to be fed forcibly in accordance with the detected position of the affixation roller.

2. The method of claim 1, wherein the amount of the adhesive tape to be fed forcibly is made large as a distance of the movement of the affixation roller becomes long.

* * * * *